US009343327B2

(12) United States Patent
Zhang et al.

(10) Patent No.: US 9,343,327 B2
(45) Date of Patent: *May 17, 2016

(54) METHODS FOR ETCH OF SIN FILMS

(71) Applicant: Applied Materials, Inc., Santa Clara, CA (US)

(72) Inventors: Jingchun Zhang, Cupertino, CA (US); Anchuan Wang, San Jose, CA (US); Nitin Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/679,242

(22) Filed: Apr. 6, 2015

(65) Prior Publication Data

US 2015/0214067 A1    Jul. 30, 2015

Related U.S. Application Data

(63) Continuation of application No. 13/416,277, filed on Mar. 9, 2012, now Pat. No. 8,999,856.

(60) Provisional application No. 61/452,575, filed on Mar. 14, 2011.

(51) Int. Cl.
| | |
|---|---|
| *H01L 21/311* | (2006.01) |
| *H01J 37/32* | (2006.01) |
| *C09K 13/00* | (2006.01) |
| *H01L 21/3065* | (2006.01) |
| *H01L 21/3213* | (2006.01) |

(52) U.S. Cl.
CPC .......... *H01L 21/31116* (2013.01); *C09K 13/00* (2013.01); *H01J 37/32357* (2013.01); *H01J 37/32422* (2013.01); *H01L 21/3065* (2013.01); *H01L 21/311* (2013.01); *H01L 21/32135* (2013.01); *H01L 21/32136* (2013.01); *H01L 21/32137* (2013.01)

(58) Field of Classification Search
None
See application file for complete search history.

(56) References Cited

U.S. PATENT DOCUMENTS

| | | | | |
|---|---|---|---|---|
| 4,793,897 | A | * | 12/1988 | Dunfield et al. .............. 438/724 |
| 8,999,856 | B2 | * | 4/2015 | Zhang ............... H01J 37/32422 216/57 |
| 9,064,815 | B2 | * | 6/2015 | Zhang ............... H01J 37/32422 |
| 2006/0024954 | A1 | * | 2/2006 | Wu et al. ....................... 438/629 |
| 2010/0173499 | A1 | * | 7/2010 | Tao et al. ....................... 438/735 |

FOREIGN PATENT DOCUMENTS

JP            09-153481          * 6/1997 .......... H01L 21/3065

* cited by examiner

*Primary Examiner* — Jiong-Ping Lu
(74) *Attorney, Agent, or Firm* — Kilpatrick Townsend & Stockton LLP

(57) ABSTRACT

A method of selectively etching silicon nitride from a substrate comprising a silicon nitride layer and a silicon oxide layer includes flowing a fluorine-containing gas into a plasma generation region of a substrate processing chamber and applying energy to the fluorine-containing gas to generate a plasma in the plasma generation region. The plasma comprises fluorine radicals and fluorine ions. The method also includes filtering the plasma to provide a reactive gas having a higher concentration of fluorine radicals than fluorine ions and flowing the reactive gas into a gas reaction region of the substrate processing chamber. The method also includes exposing the substrate to the reactive gas in the gas reaction region of the substrate processing chamber. The reactive gas etches the silicon nitride layer at a higher etch rate than the reactive gas etches the silicon oxide layer.

16 Claims, 12 Drawing Sheets

METHODS FOR ETCH OF SiN FILMS

CROSS-REFERENCES TO RELATED APPLICATIONS

The present application is a continuation of U.S. patent application Ser. No. 13/416,277 filed Mar. 9, 2012, issued as U.S. Pat. No. 8,999,856 on Apr. 7, 2015, which claims benefit of U.S. Provisional Application No. 61/452,575, filed Mar. 14, 2011, the contents of which are incorporated herein by reference in its entirety for all purposes.

The present application is also related to U.S. Nonprovisional patent application Ser. No. 13/088,930, filed Apr. 18, 2011; Ser. No. 13/251,663, filed Oct. 3, 2011; and U.S. Nonprovisional patent application Ser. No. 13/416,223, filed Mar. 9, 2012 ; the contents of which are each incorporated herein by reference in their entirety for all purposes.

BACKGROUND

Integrated circuits are made possible by processes which produce intricately patterned layers of materials on substrate surfaces. Producing patterned material on a substrate requires controlled methods for removal of exposed materials. Chemical etching is used for a variety of purposes including transferring a pattern in photoresist into underlying layers, thinning layers, or increasing lateral dimensions of features already present on the surface. Often it is desirable to have an etch process which etches one material faster than another. Such an etch process is said to be selective to the first material. As a result of the diversity of materials, circuits, and processes, etch processes have been developed with a selectivity towards a variety of materials.

Plasma deposition and etching processes for fabricating semiconductor integrated circuits have been in wide use for decades. These processes typically involve the formation of a plasma from gases that are exposed to electric fields of sufficient power inside the processing chamber to cause the gases to ionize. The temperatures needed to form these plasmas can be much lower than needed to thermally ionize the same gases. Thus, plasma generation processes can be used to generate reactive radical and ion species at significantly lower chamber processing temperatures than is possible by simply heating the gases. This allows the plasma to deposit and/or etch materials from substrate surfaces without raising the substrate temperature above a threshold that will melt, decompose, or otherwise damage materials on the substrate.

Exemplary plasma deposition processes include plasma-enhanced chemical vapor deposition (PECVD) of dielectric materials such as silicon oxide on exposed surfaces of a substrate wafer. Conventional PECVD involves the mixing of gases and/or deposition precursors in the processing chamber and striking a plasma from the gases to generate reactive species that react and deposit material on the substrate. The plasma is typically positioned close to the exposed surface of the substrate to facilitate the efficient deposition of the reaction products.

Similarly, plasma etching processes include exposing selected parts of the substrate to plasma activated etching species that chemically react and/or physically sputter materials from the substrate. The removal rates, selectivity, and direction of the plasma etched materials can be controlled with adjustments to the etchant gases, plasma excitation energy, and electrical bias between the substrate and charged plasma species, among other parameters. Some plasma techniques, such as high-density plasma chemical vapor deposition (HDP-CVD), rely on simultaneous plasma etching and deposition to deposit films on the substrate.

While plasma environments are generally less destructive to substrates than high-temperature deposition environments, they still create fabrication challenges. Etching precision can be a problem with energetic plasmas that over-etch shallow trenches and gaps. Energetic species in the plasmas, especially ionized species, can create unwanted reactions in a deposited material that adversely affect the material's performance. Thus, there is a need for systems and methods to provide more precise control over the plasma components that make contact with a substrate wafer during fabrication.

SUMMARY

Systems and methods are described for improved control of the environment between a plasma and the surfaces of a substrate wafer that are exposed to plasma and/or its effluents. The improved control may be realized at least in part by an ion suppression element positioned between the plasma and the substrate that reduces or eliminates the number of ionically-charged species that reach the substrate. Adjusting the concentration of ion species that reach the substrate surface allows more precise control of the etch rate, etch selectivity, and deposition chemistry (among other parameters) during a plasma assisted etch and/or deposition on the substrate.

In an embodiment, a method of selectively etching silicon nitride from a substrate comprising a silicon nitride layer and a silicon oxide layer is provided. The method includes flowing a fluorine-containing gas into a plasma generation region of a substrate processing chamber, and applying energy to the fluorine-containing gas to generate a plasma in the plasma generation region. The plasma comprises fluorine radicals and fluorine ions. The method also includes filtering the plasma to provide a reactive gas having a higher concentration of fluorine radicals than fluorine ions, and flowing the reactive gas into a gas reaction region of the substrate processing chamber. The method also includes exposing the substrate to the reactive gas in the gas reaction region of the substrate processing chamber. The reactive gas etches the silicon nitride layer at a higher etch rate than the reactive gas etches the silicon oxide layer.

In another embodiment, an etch process providing a higher etch rate of silicon nitride than an etch rate of silicon oxide is provided. The process includes generating a plasma from a fluorine-containing gas. The plasma comprises fluorine radicals and fluorine ions. The process also includes removing a portion of the fluorine ions from the plasma to provide a reactive gas having a higher concentration of fluorine radicals than fluorine ions, and exposing a substrate comprising a silicon nitride layer and a silicon oxide layer to the reactive gas. The reactive gas etches the silicon nitride layer at a higher etch rate than the reactive gas etches the silicon oxide layer.

Additional embodiments and features are set forth in part in the description that follows and will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings, wherein like reference numerals are used throughout the several drawings to refer to similar components. In some instances, a sub-label is associated with a reference numeral and follows a hyphen to denote one of multiple similar components. When reference is made to a reference numeral without specifying an existing sub-label, it is intended to refer to all such multiple similar components.

DETAILED DESCRIPTION

Systems and methods are described for the generation and control of a plasma inside a semiconductor processing chamber. The plasma may originate inside the processing chamber, outside the processing chamber in a remote plasma unit, or both. Inside the chamber, the plasma is contained and separated from the substrate wafer with the help of an ion suppression element that is positioned between the plasma and the substrate wafer. In some instances, this ion suppression element may also function as part of a plasma generation unit (e.g., an electrode), a gas/precursor distribution system (e.g., a showerhead), and/or another component of the processor system. In additional instances, the ion suppression element may function primarily to define a partition between a plasma generation region and a gas reaction region that etches and/or deposits material on exposed surfaces of the substrate wafer.

The ion suppression element functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process.

Exemplary Processing System Configurations

Exemplary processing system configurations include an ion suppressor positioned inside a processing chamber to control the type and quantity of plasma excited species that reach the substrate. In some embodiments the ion suppressor unit may be a perforated plate that may also act as an electrode of the plasma generating unit. In additional embodiments the ion suppressor may be the showerhead that distributes gases and excited species to a reaction region in contact with the substrate. In still more embodiments ion suppression may be realized by a perforated plate ion suppressor and a showerhead, both of which plasma excited species pass through to reach the reaction region.

Figure 1:
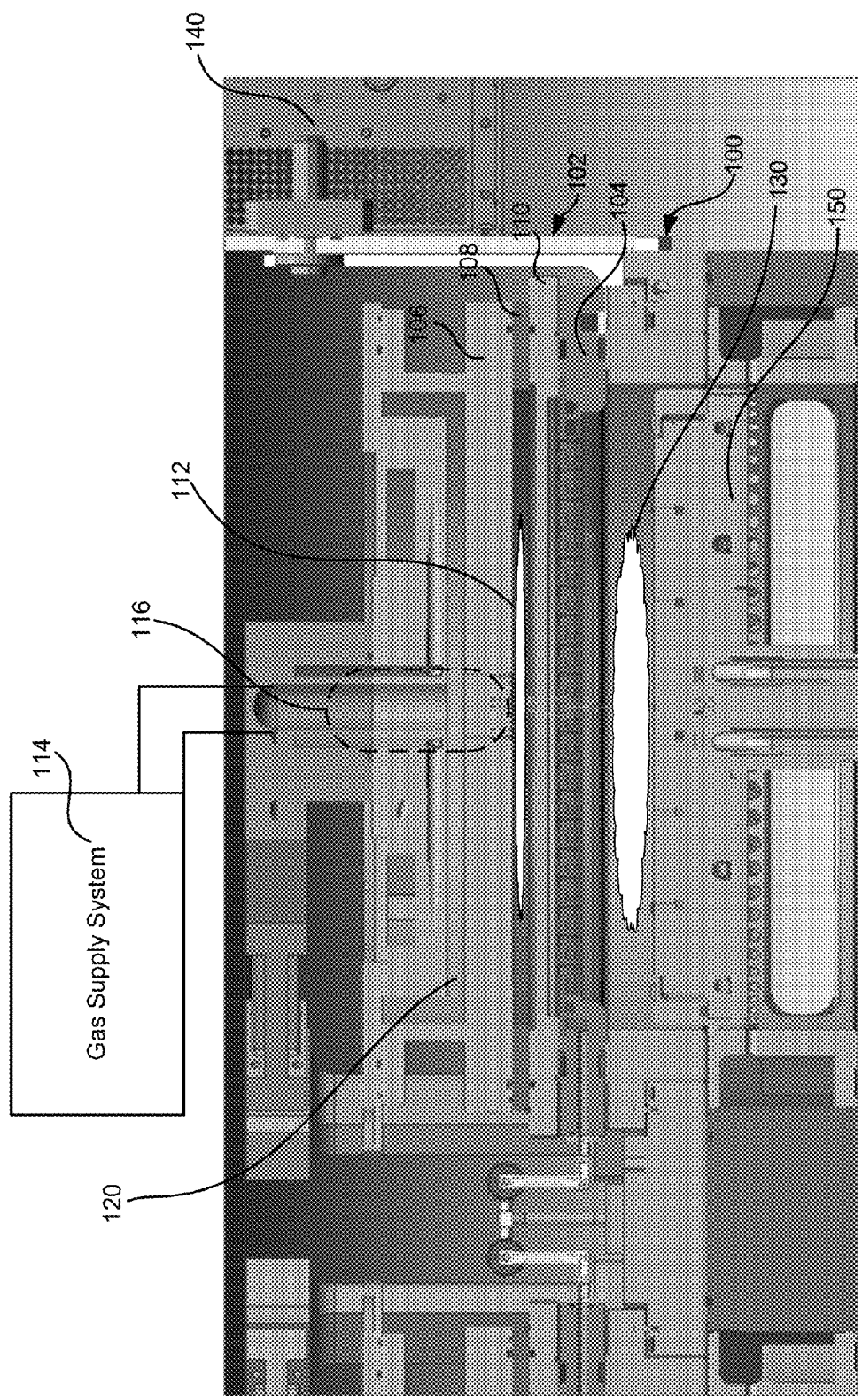
FIG. 1 shows a simplified cross-sectional view of a processing system that includes a processing chamber having a capacitively coupled plasma (CCP) unit and a showerhead according to an embodiment of the invention.
Figure 2:
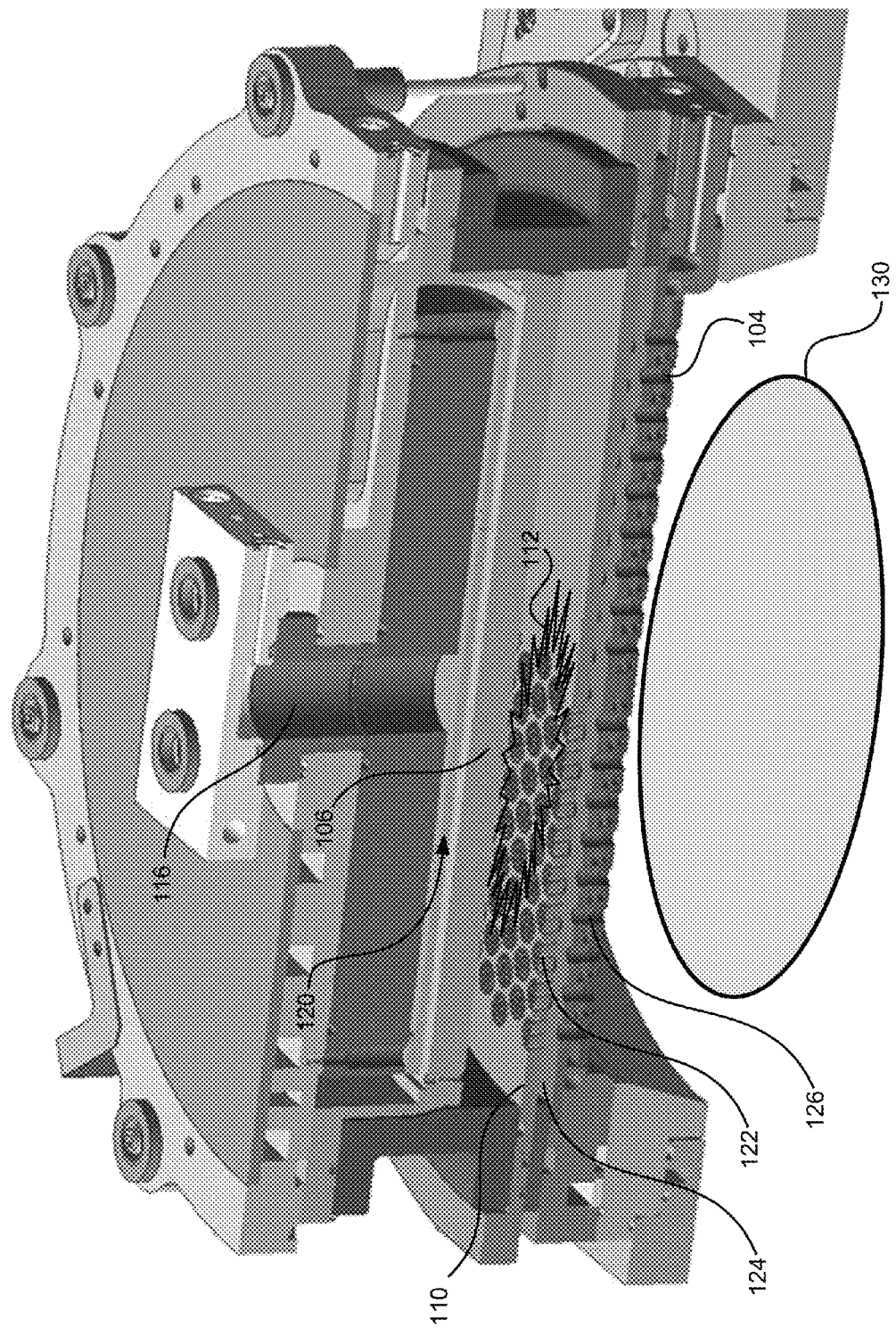
FIG. 2 shows a simplified perspective view of a processing system that includes a processing chamber having a CCP unit and a showerhead according to an embodiment of the invention.

FIGS. 1 and 2 show simplified cross-sectional and perspective views, respectively, of a processing system that includes both an ion suppressor 110 as part of a capacitively coupled plasma (CCP) unit 102 and a showerhead 104 that may also contribute to ion suppression. The processing system may also optionally include components located outside the processing chamber 100, such as fluid supply system 114. The processing chamber 100 may hold an internal pressure different than the surrounding pressure. For example, the pressure inside the processing chamber may be about 1 mTorr to about 100 Torr.

The CCP unit 102 may function to generate a plasma inside the processing chamber 100. The components of the CCP unit 102 may include a lid or hot electrode 106 and an ion suppression element 110 (also referred to herein as an ion suppressor). In some embodiments, the lid 106 and ion suppressor 110 are electrically conductive electrodes that can be electrically biased with respect to each other to generate an electric field strong enough to ionize gases between the electrodes into a plasma. An electrical insulator 108, may separate the lid 106 and the ion suppressor 110 electrodes to prevent them from short circuiting when a plasma is generated. The plasma exposed surfaces of the lid 106, insulator 108, and ion suppressor 110 may define a plasma excitation region 112 in the CCP unit 102.

Plasma generating gases may travel from a gas supply system 114 through a gas inlet 116 into the plasma excitation region 112. The plasma generating gases may be used to strike a plasma in the excitation region 112, or may maintain a plasma that has already been formed. In some embodiments, the plasma generating gases may have already been at least partially converted into plasma excited species in a remote plasma system (not shown) positioned outside the processing chamber 100 before traveling downstream though the inlet 116 to the CCP unit 102. When the plasma excited species reach the plasma excitation region 112, they may be further excited in the CCP unit 102, or pass through the plasma excitation region without further excitation. In some operations, the degree of added excitation provided by the CCP unit 102 may change over time depending on the substrate processing sequence and/or conditions.

The plasma generating gases and/or plasma excited species may pass through a plurality of holes (not shown) in lid 106 for a more uniform delivery into the plasma excitation region 112. Exemplary configurations include having the inlet 116 open into a gas supply region 120 partitioned from the plasma excitation region 112 by lid 106 so that the gases/species flow through the holes in the lid 106 into the plasma excitation region 112. Structural and operational features may be selected to prevent significant backflow of plasma from the plasma excitation region 112 back into the supply region 120, inlet 116, and fluid supply system 114. The structural features may include the selection of dimensions and cross-sectional geometry of the holes in lid 106 that deactivates back-streaming plasma, as described below with reference to FIGS. 7A and 7B. The operational features may include maintaining a pressure difference between the gas supply region 120 and plasma excitation region 112 that maintains a unidirectional flow of plasma through the ion suppressor 110.

As noted above, the lid 106 and the ion suppressor 110 may function as a first electrode and second electrode, respectively, so that the lid 106 and/or ion suppressor 110 may receive an electric charge. In these configurations, electrical power (e.g., RF power) may be applied to the lid 106, ion suppressor 110, or both. For example, electrical power may be applied to the lid 106 while the ion suppressor 110 is grounded. The substrate processing system may include a RF generator 140 that provides electrical power to the lid 106 and/or ion suppressor 110. The electrically charged lid 106 may facilitate a uniform distribution of plasma (i.e., reduce localized plasma) within the plasma excitation region 112. To enable the formation of a plasma in the plasma excitation region 112, insulator 108 may electrically insulate lid 106 and ion suppressor 110. Insulator 108 may be made from a ceramic and may have a high breakdown voltage to avoid sparking. The CCP unit 102 may further include a cooling unit (not shown) that includes one or more cooling fluid channels to cool surfaces exposed to the plasma with a circulating coolant (e.g., water).

The ion suppressor 110 may include a plurality of holes 122 that suppress the migration of ionically-charged species out of the plasma excitation region 112 while allowing uncharged neutral or radical species to pass through the ion suppressor 110 into an activated gas delivery region 124. These uncharged species may include highly reactive species that are transported with less reactive carrier gas through the holes 122. As noted above, the migration of ionic species through the holes 122 may be reduced, and in some instances completely suppressed. Controlling the amount of ionic species passing through the ion suppressor 110 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., SiNx:SiOx etch ratios, metal:SiOx etch ratios, metal:SiNx etch ratios, Poly-Si:SiOx etch ratios, etc.). It can also shift the balance of conformal-to-flowable of a deposited dielectric material.

The plurality of holes 122 may be configured to control the passage of the activated gas (i.e., the ionic, radical, and/or neutral species) through the ion suppressor 110. For example, the aspect ratio of the holes (i.e., the hole diameter to length) and/or the geometry of the holes may be controlled so that the flow of ionically-charged species in the activated gas passing through the ion suppressor 110 is reduced. The holes in the ion suppressor 110 may include a tapered portion that faces the plasma excitation region 112, and a cylindrical portion that faces the showerhead 104. The cylindrical portion may be shaped and dimensioned to control the flow of ionic species passing to the showerhead 104. An adjustable electrical bias may also be applied to the ion suppressor 110 as an additional means to control the flow of ionic species through the suppressor.

The showerhead 104 is positioned between the ion suppressor 110 of the CCP unit 102 and a gas reaction region 130 (i.e., gas activation region) that makes contact with a substrate that may be mounted on a pedestal 150. The gases and plasma excited species may pass through the ion suppressor 110 into an activated gas delivery region 124 that is defined between the ion suppressor 110 and the showerhead 104. A portion of these gases and species may further pass thorough the showerhead 104 into a gas reaction region 130 that makes contact with the substrate.

The showerhead may be a dual-zone showerhead that has a first set of channels 126 to permit the passage of plasma excited species, and a second set of channels that deliver a second gas/precursor mixture into the gas reaction/activation region 130. The two sets of channels prevent the plasma excited species and second gas/precursor mixture from combining until they reach the gas reaction region 130. In some embodiments, one or more of the holes 122 in the ion suppressor 110 may be aligned with one or more of the channels 126 in the showerhead 104 to allow at least some of the plasma excited species to pass through a hole 122 and a channel 126 without altering their direction of flow. In additional embodiments, the second set of channels may have an annular shape at the opening facing the gas reaction region 130, and these annular openings may be concentrically aligned around the circular openings of the first set of channels 126.

The second set of channels in the showerhead 104 may be fluidly coupled to a source gas/precursor mixture (not shown) that is selected for the process to be performed. For example, when the processing system is configured to perform a deposition of a dielectric material such as silicon dioxide ($SiO_x$) the gas/precursor mixture may include a silicon-containing gas or precursor such as silane, disilane, TSA, DSA, TEOS, OMCTS, TMDSO, among other silicon-containing materials. This mixture may react in gas reaction region 130 with an oxidizing gas mixture that may include plasma excited species such as plasma generated radical oxygen (O), activated molecular oxygen ($O_2$), and ozone ($O_3$), among other species. Excessive ions in the plasma excited species may be reduced as the species move through the holes 122 in the ion suppressor 110, and reduced further as the species move through the channels 126 in the showerhead 104. In another example, when the processing system is configured to perform an etch on the substrate surface, the source gas/precursor mixture may include etchants such as oxidants, halogens, water vapor and/or carrier gases that mix in the gas reaction region 130 with plasma excited species distributed from the first set of channels in the showerhead 104.

The processing system may further include a power supply 140 electrically coupled to the CCP unit 102 to provide electric power to the lid 106 and/or ion suppressor 110 to generate a plasma in the plasma excitation region 112. The power supply may be configured to deliver an adjustable amount of power to the CCP unit 102 depending on the process performed. In deposition processes, for example, the power delivered to the CCP unit 102 may be adjusted to set the conformality of the deposited layer. Deposited dielectric films are typically more flowable at lower plasma powers and shift from flowable to conformal when the plasma power is increased. For example, an argon containing plasma maintained in the plasma excitation region 112 may produce a more flowable silicon oxide layer as the plasma power is decreased from about 1000 Watts to about 100 Watts or lower (e.g., about 900, 800, 700, 600, or 500 Watts or less), and a more conformal layer as the plasma power is increased from about 1000 Watts or more (e.g., about 1000, 1100, 1200, 1300, 1400, 1500, 1600, 1700 Watts or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film.

The processing system may still further include a pedestal 150 that is operable to support and move the substrate (e.g., a wafer substrate). The distance between the pedestal 150 and the showerhead 104 help define the gas reaction region 130. The pedestal may be vertically or axially adjustable within the processing chamber 100 to increase or decrease the gas reaction region 130 and effect the deposition or etching of the wafer substrate by repositioning the wafer substrate with respect to the gases passed through the showerhead 104. The pedestal 150 may have a heat exchange channel through which a heat exchange fluid flows to control the temperature of the wafer substrate. Circulation of the heat exchange fluid allows the substrate temperature to be maintained at relatively low temperatures (e.g., about −20° C. to about 90° C.). Exemplary heat exchange fluids include ethylene glycol and water.

The pedestal 150 may also be configured with a heating element (such as a resistive heating element) to maintain the substrate at heating temperatures (e.g., about 90° C. to about 1100° C.). Exemplary heating elements may include a single-loop heater element embedded in the substrate support platter that makes two or more full turns in the form of parallel concentric circles. An outer portion of the heater element may run adjacent to a perimeter of the support platen, while an inner portion may run on the path of a concentric circle having a smaller radius. The wiring to the heater element may pass through the stem of the pedestal.

Figure 3:
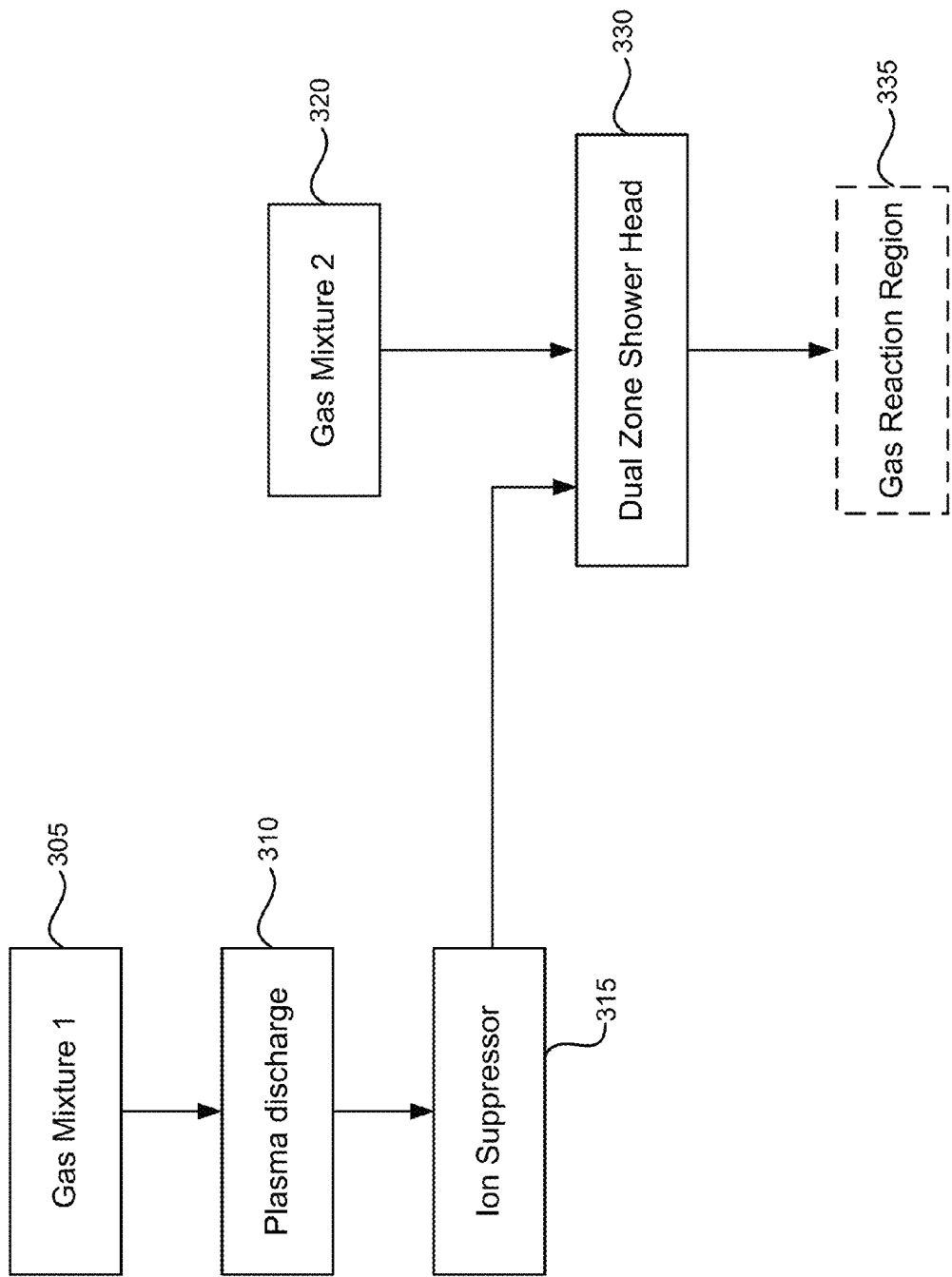
FIG. 3 shows a simplified schematic of the gas flow paths of a pair of gas mixtures through a processing system according to an embodiment of the invention.

FIG. 3 shows a simplified schematic of the gas flow paths of a pair of gas mixtures through a processing system that includes both an ion suppressor plate and a showerhead. At block 305, a first gas, such as a plasma generating gas mixture, is supplied to the processing chamber via a gas inlet. The first gas may include one or more of the following gases: $CF_4$, $NH_3$, $NF_3$, Ar, He, $H_2O$, $H_2$, $O_2$, etc. Inside the processing chamber, the first gas may be excited through a plasma discharge to form one or more plasma effluents at block 310. Alternatively (or in addition to the in-situ plasma generation), a remote plasma system (RPS) coupled to the processing chamber may be used to generate an ex-situ plasma whose plasma excitation products are introduced into the process chamber. The RPS plasma excitation products may include ionically-charged plasma species as well as neutral and radical species.

Whether the plasma effluents are generated by an in-situ plasma unit, an RPS unit, or both, they may be passed through an ion suppressor in the processing chamber at block 315. The ion suppressor may block and/or control the passage of ionic species while allowing the passage of radical and/or neutral species as the plasma activated first gas travels to the gas reaction region in the processing chamber. At block 320, a second gas may be introduced into the processing chamber. As noted above, the contents of the second gas depend on the process performed. For example, the second gas may include deposition compounds (e.g., Si-containing compounds) for deposition processes and etchants for etch processes. Contact and reaction between the first and second gases may be prevented until the gases arrive at the gas reaction region of the process chamber.

One way to prevent the first and second gases from interacting before the gas reaction region is to have them flow though separate channels in a dual-zone showerhead (DZSH). Block 330 shows the activated first gas and second gas passing through a DZSH 33 that has a first plurality of channels that permit the activated first gas to pass through the showerhead without interacting with the second gas that passes through a second plurality of channels. After exiting the DZSH, the first and second gases may mix together in the gas reaction region of the processing chamber at block 335. Depending on the process performed, the combined gases may react to deposit a material on the exposed surfaces of the substrate, etch materials from the substrate, or both.

Figure 4:
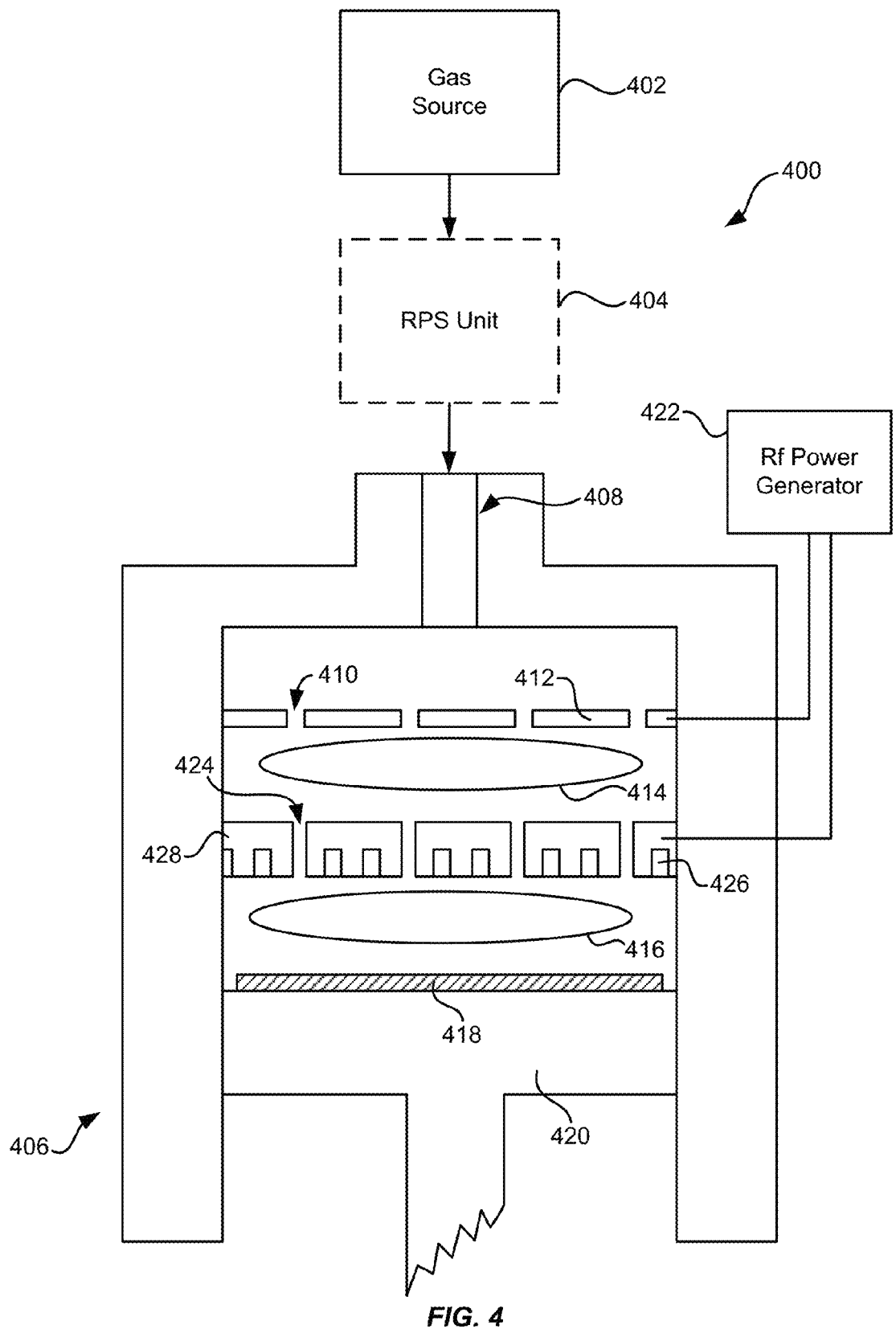
FIG. 4 shows a simplified cross-sectional view of a processing system that includes a processing chamber having a showerhead that also acts as an ion suppression element according to an embodiment of the invention.

Referring now to FIG. 4, a simplified cross-sectional view of a processing system 400 having a showerhead 428 that also acts as an ion suppression element is shown. In the configuration shown, a first gas source 402 for plasma generation is fluidly coupled to an optional RPS unit 404 where a first plasma may be generated and the plasma effluents transported into the processing chamber 406 through gas inlet 408. Inside the processing chamber 406, the gases may pass through holes 410 in a gas distribution plate 412 into a gas region 414 defined between the plate 412 and showerhead 428. In some embodiments, this region 414 may be a plasma excitation/activation region where the gas distribution plate 412 and showerhead 428 act as first and second electrodes to further excite the gas and/or generate the first plasma. The holes 410 in the gas distribution plate 412 may be dimensionally or geometrically structured to deactivate back-streaming plasma. The plate 412 and showerhead 428 may be coupled with a RF power generator 422 that supplies a charge to the plate 412 and showerhead 428 to excite the gases and/or generate a plasma. In one embodiment, the showerhead 428 is grounded while a charge is applied to plate 412.

The excited gases or activated gases in the gas region 414 may pass through showerhead 428 into a gas reaction region 416 adjacent a substrate 418 to etch material from the surface of the substrate and/or deposit material on the substrate's surface. The showerhead 428 may be a DZSH that allows the excited gases to pass from the gas region 414 into the gas reaction region 416 while also allowing a second gas (i.e., precursor gas/mixture) to flow from an external source (not shown) into the gas reaction region 416 via a second gas inlet 426. The DZSH may prevent the activated/excited gas from mixing with the second gas until the gases flow into the gas reaction region 416.

Figure 7A:
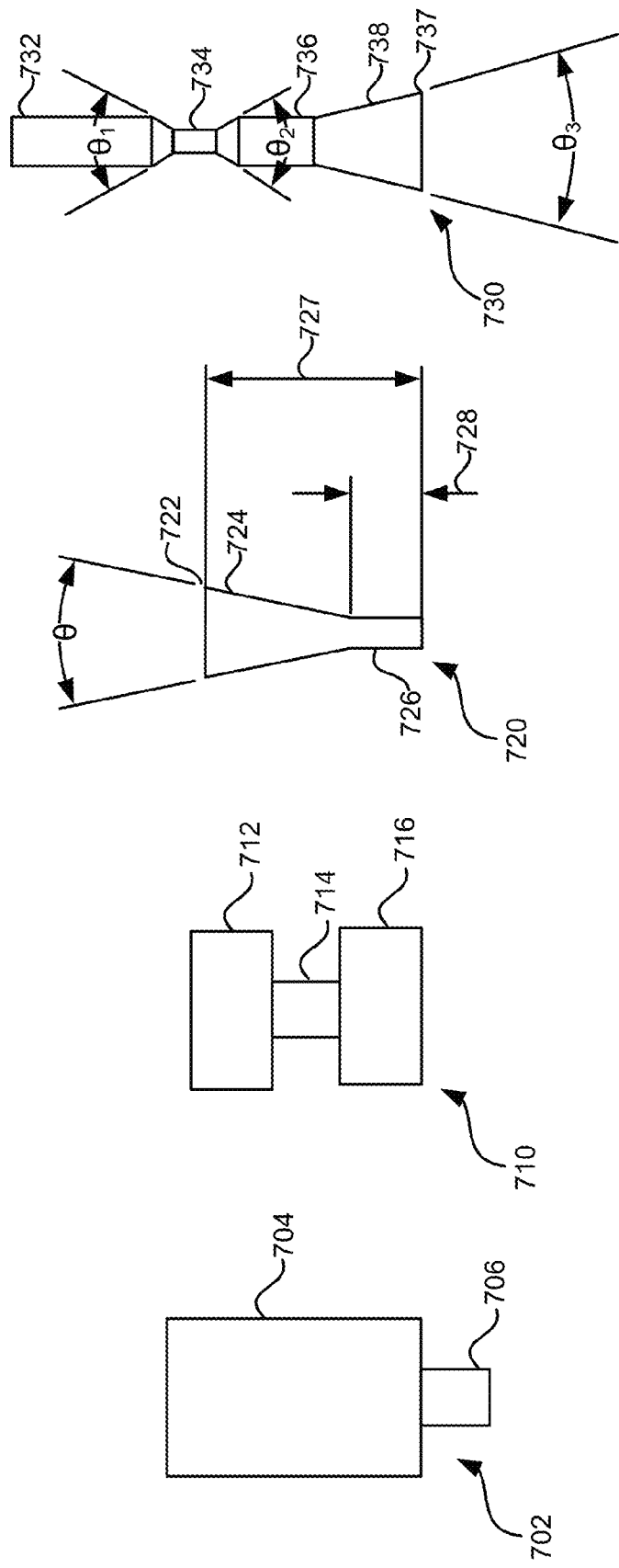
FIG. 7A shows some exemplary hole geometries for openings in an ion-suppression element according to an embodiment of the invention.

The excited gas may flow through a plurality of holes 424 in the DZSH, which may be dimensionally and/or geometrically structured to control or prevent the passage of plasma (i.e., ionically charged species) while allowing the passage of activated/excited gases (i.e., reactive radical or uncharged neutral species). FIG. 7A provides exemplary embodiments of hole configurations that may be used in the DZSH. In addition to the holes 424, the DZSH may include a plurality of channels 426 through which the second gas flows. The second gas (precursor gas) may exit the showerhead 428 through one or more apertures (not shown) that are positioned adjacent holes 424. The DZSH may act as both a second gas delivery system and an ion suppression element.

As described above, the mixed gases may deposit a material on and/or etch a material from the surface of the substrate 418, which may be positioned on a platen 420. The platen 420 may be vertically movable within the processing chamber

406. The processing of the substrate 418 within the processing chamber 406 may be affected by the configurations of the holes 424, the pressure within the gas region 414, and/or the position of the substrate 418 within the processing chamber. Further, the configuration of the holes 424 and/or pressure within the gas region 414 may control the concentration of ionic species (plasma) allowed to pass into the gas excitation region 416. The ionic concentration of the gas mixture can shift the balance of conformal-to-flowable of a deposited dielectric material in addition to altering the etch selectivity.

Figure 5:
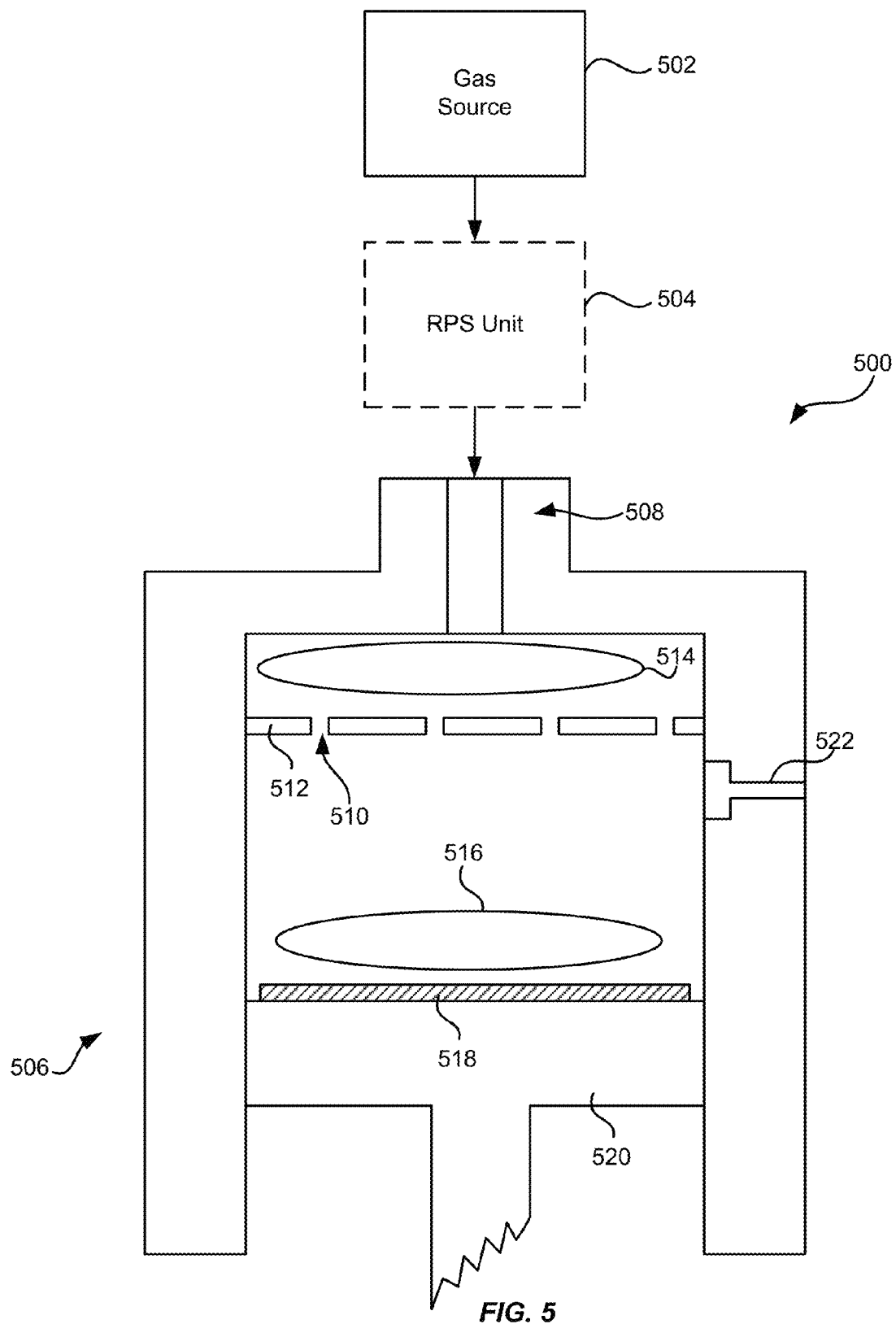
FIG. 5 shows a simplified cross-sectional view of a processing system that includes a processing chamber with an ion suppression plate partitioning a plasma region from a gas reaction region according to an embodiment of the invention.

Referring now to FIG. 5, a simplified cross-sectional view of another processing system 500 having a plate 512 (i.e., ion suppressor plate) that acts as an ion suppression element is shown. In the configuration shown, a first gas source 502 is fluidly coupled to an RPS unit 504 where a first plasma may be generated and the plasma effluents transported into the processing chamber 506 through gas inlet 508. The plasma effluents may be transported to a gas region 514 defined between the ion suppressor plate 512 and the gas inlet 508. Inside the gas region 514, the gases may pass through holes 510 in the ion suppressor 512 into a gas reaction/activation region 516 defined between the ion suppressor 512 and a substrate 518. The substrate 518 may be supported on a platen 520 as described above so that the substrate is movable within the processing chamber 506.

Also as described above, the holes 510 may be dimensionally and/or geometrically structured so that the passage of ionically charged species (i.e., plasma) is prevented and/or controlled while the passage of uncharged neutral or radical species (i.e., activated gas) is permitted. The passage of ionic species may be controllable by varying the pressure of the plasma within gas region 514. The pressure in gas region 514 may be controlled by controlling the amount of gas delivered through gas inlet 508. The precursor gas (i.e., second gas) may be introduced into the processing chamber 506 at one or more second gas inlets 522 positioned vertically below or parallel with ion suppressor 512. The second gas inlet 522 may include one or more apertures, tubes, etc. (not shown) in the processing chamber 506 walls and may further include one or more gas distribution channels (not shown) to deliver the precursor gas to the apertures, tubes, etc. In one embodiment, the ion suppressor 512 includes one or more second gas inlets, through which the precursor gas flows. The second gas inlets of the ion suppressor 512 may deliver the precursor gas into the gas reaction region 516. In such an embodiment, the ion suppressor 512 functions as both an ion suppressor and a dual zone showerhead as described previously. The activated gas that passes through the holes 510 and the precursor gas introduced in the processing chamber 506 may be mixed in the gas reaction chamber 516 for etching and/or deposition processes.

Having now described exemplary embodiments of processing chambers, attention is now directed to exemplary embodiments of ion suppressors, such as ion suppressor plates 412 and 512 and showerhead 428.

Exemplary Ion Suppressors

Figure 6A:
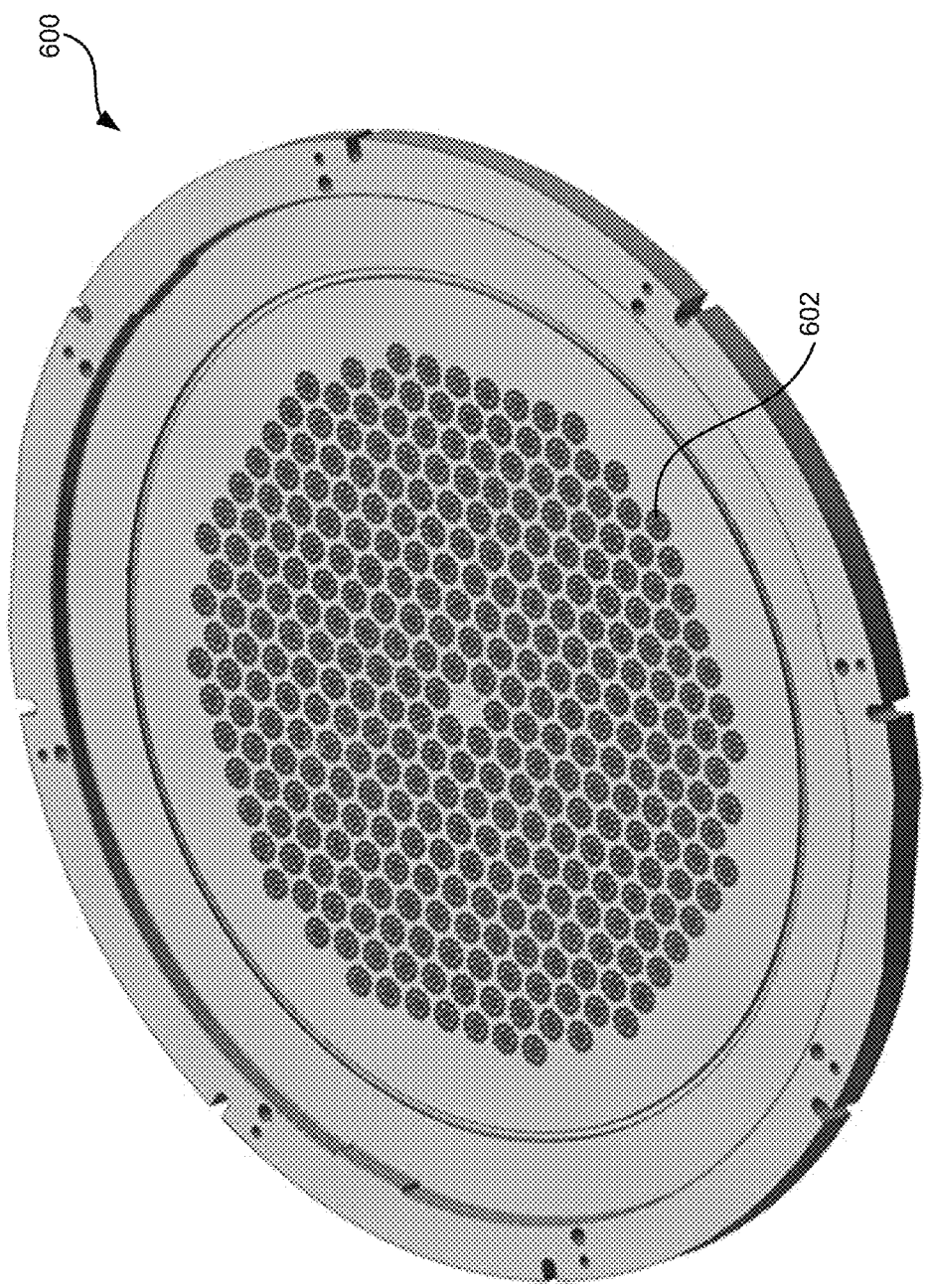
FIG. 6A shows a simplified perspective view of an ion-suppression element according to an embodiment of the invention.

FIG. 6A shows a simplified perspective view of an ion-suppression element 600 (ion suppressor) according to an embodiment of the invention. The ion suppression element 600 may correspond with the ion suppressor plates of FIG. 4 and/or FIG. 5. The perspective view shows the top of the ion suppression element or plate 600. The ion suppression plate 600 may be generally circular shaped and may include a plurality of plasma effluent passageways 602, where each of the passageways 602 includes one or more through holes that allow passage of the plasma effluents from a first region (e.g., plasma region) to a second region (e.g., gas reaction region or showerhead). In one embodiment, the through holes of the passageway 602 may be arranged to form one or more circular patterns, although other configurations are possible. As described previously, the through holes may be geometrically or dimensionally configured to control or prevent the passage of ion species while allowing the passage or uncharged neutral or radical species. The through holes may have a larger inner diameter toward the top surface of the ion suppression plate 600 and a smaller inner diameter toward the bottom surface of the ion suppression plate. Further, the through holes may be generally cylindrical, conical, or any combination thereof. Exemplary embodiments of the configurations of the through holes are provided in FIGS. 7A-B.

The plurality of passageways may be distributed substantially evenly over the surface of the ion suppression plate 600, which may provide even passage of neutral or radical species through the ion suppression plate 600 into the second region. In some embodiments, such as the embodiment of FIG. 5, the processing chamber may only include an ion suppression plate 600, while in other embodiments, the processing chamber may include both a ion suppression plate 600 and a showerhead, such as the showerhead of FIG. 6B, or the processing chamber may include a single plate that acts as both a dual zone showerhead and an ion suppression plate.

Figure 6B:
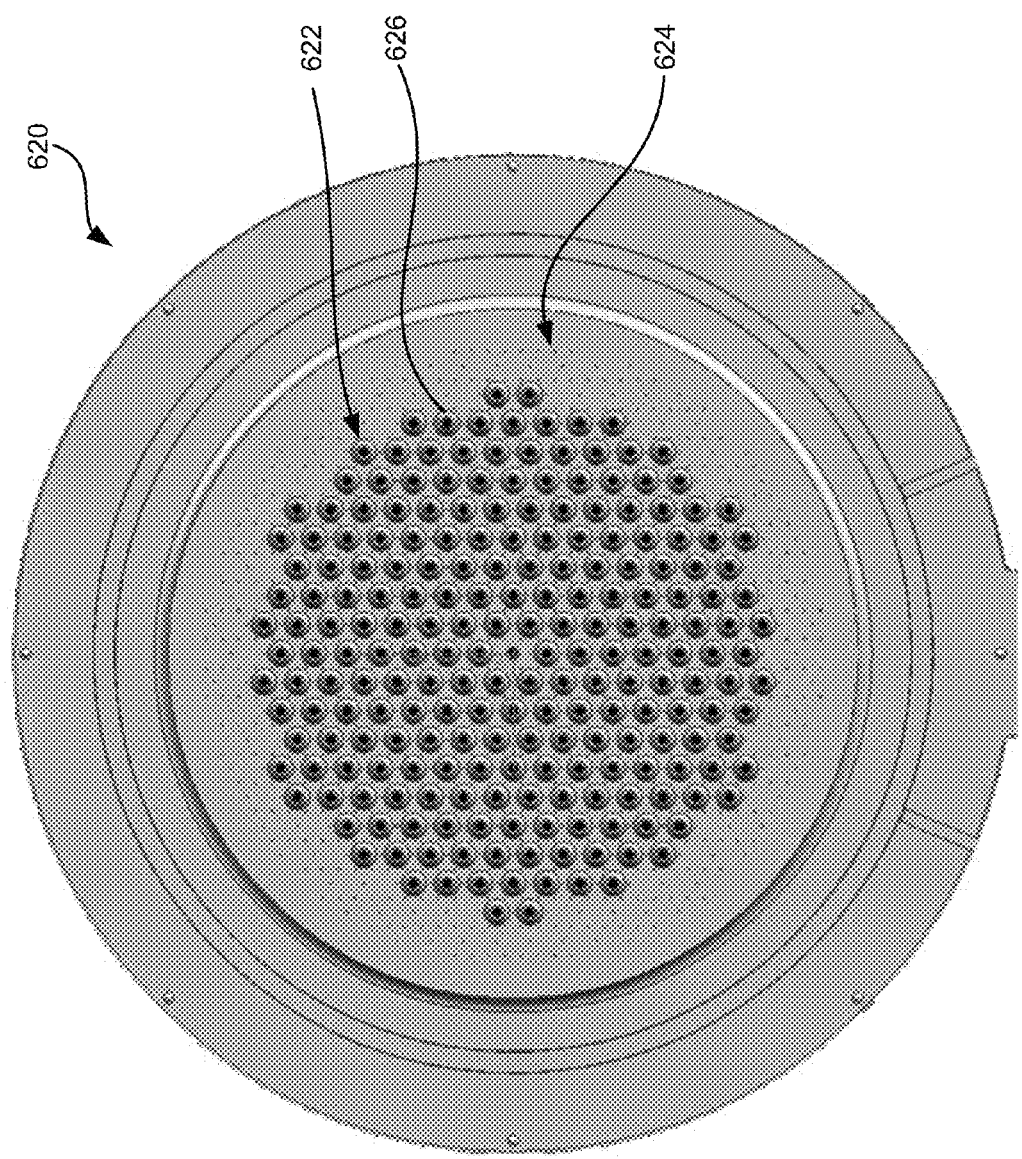
FIG. 6B shows a simplified perspective view of a showerhead that also acts as an ion-suppression element according to an embodiment of the invention.

FIG. 6B shows a simplified bottom view perspective of a showerhead 620 according to an embodiment of the invention. The showerhead 620 may correspond with the showerhead illustrated in FIG. 4. As described previously, the showerhead 620 may be positioned vertically adjacent to and above a gas reaction region. Similar to ion suppression plate 600, the showerhead 620 may be generally circular shaped and may include a plurality of first holes 622 and a plurality of second holes 624. The plurality of first holes 622 may allow plasma effluents to pass through the showerhead 620 into a gas reaction region, while the plurality of second holes 624 allow a precursor gas, such as a silicon precursor, etchants etc., to pass into the gas reaction region.

The plurality of first holes 622 may be through holes that extend from the top surface of the showerhead 620 through the showerhead. In one embodiment, each of the plurality of first holes 622 may have a smaller inner diameter (ID) toward the top surface of the showerhead 620 and a larger ID toward the bottom surface. In addition, the bottom edge of the plurality of first holes 622 may be chamfered 626 to help evenly distribute the plasma effluents in the gas reaction region as the plasma effluents exit the showerhead and thereby promote even mixing of the plasma effluents and precursor gases. The smaller ID of the first holes 622 may be between about 0.5 mm and about 20 mm. In one embodiment, the smaller ID may be between about 1 mm and 6 mm. The cross sectional shape of the first holes 622 may be generally cylindrical, conical, or any combination thereof. Further, the first holes 622 may be concentrically aligned with the through holes of passageways 602, when both an ion suppression element 600 and a showerhead 620 are used in a processing chamber. The concentric alignment may facilitate passage of an activated gas through both the ion suppression element 600 and showerhead 620 in the processing chamber.

In another embodiment, the plurality of first holes 622 may be through holes that extend from the top surface of the showerhead 620 through the showerhead, where each of the first holes 622 have a larger ID toward the top surface of the showerhead and a smaller ID toward the bottom surface of the showerhead. Further, the first holes 622 may include a taper region that transitions between the larger and smaller IDs. Such a configuration may prevent or regulate the passage of a plasma through the holes while permitting the passage of an activated gas. Such embodiments may be used in place of or in addition to ion suppression element 600. Exemplary embodiments of such through holes are provided in FIG. 7A.

The number of the plurality of first holes 622 may be between about 60 and about 2000. The plurality of first holes 622 may also have a variety of shapes, but are generally round. In embodiments where the processing chamber includes both a ion suppression plate 600 and a showerhead 620, the plurality of first holes 622 may be substantially aligned with the passageways 602 to facilitate passage of the plasma effluents through the ion suppression plate and showerhead.

The plurality of second holes 624 may extend from the bottom surface of the showerhead 620 partially through the showerhead. The plurality of second holes may be coupled with or connected to a plurality of channels (not shown) that deliver the precursor gas (e.g., deposition compounds, etchants, etc.) to the second holes 624 from an external gas source (not shown). The second holes may include a smaller ID at the bottom surface of the showerhead 620 and a larger ID in the interior of the showerhead. The number of second holes 624 may be between about 100 and about 5000 or between about 500 and about 2000 in different embodiments. The diameter of the second holes' smaller ID (i.e., the diameter of the hole at the bottom surface) may be between about 0.1 mm and about 2 mm. The second holes 624 are generally round and may likewise be cylindrical, conical, or any combination thereof. Both the first and second holes may be evenly distributed over the bottom surface of the showerhead 620 to promote even mixing of the plasma effluents and precursor gases.

With reference to FIG. 7A, exemplary configurations of the through holes are shown. The through holes depicted generally include a large inner diameter (ID) region toward an upper end of the hole and a smaller ID region toward the bottom or lower end of the hole. The smaller ID may be between about 0.2 mm and about 5 mm. Further, aspect ratios of the holes (i.e., the smaller ID to hole length) may be approximately 1 to 20. Such configurations may substantially block and/or control passage of ion species of the plasma effluent while allowing the passage of radical or neutral species. For example, varying the aspect ratio may regulate the amount of plasma that is allowed to pass through the through holes. Plasma passage may further be regulated by varying the pressure of the plasma within a region directly above the through holes.

Referring now to specific configurations, through hole 702 may include a large ID region 704 at an upper end of the hole and a small ID region 706 at a lower end of the hole with a stepped edge between the large and small IDs. Through hole 710 may include a large ID region 712 on an upper end and a large ID region 716 on a lower end of the hole with a small ID region 714 therebetween. The transition between the large and small ID regions may be stepped or blunt to provide an abrupt transition between the regions.

Through hole 720 may include a large ID region 722 at the upper end of the hole and small ID region 726 at a lower end of the hole with a tapered region 724 that transitions at an angle θ between the large and small regions. The height 728 of the small ID region 726 may depend on the overall height 727 of the hole, the angle θ of tapered region 724, the large ID, and the small ID. In one embodiment, the tapered region 724 comprises an angle of between about 15° and about 30°, and preferably about 22°; the overall height 727 is between about 4 mm and about 8 mm, and preferably about 6.35 mm; the large ID is between about 1 mm and about 4 mm, and preferably about 2.54 mm; the small ID is between about 0.2 mm and 1.2 mm, and preferably about 0.89 mm, so that the height 728 of the small ID region 726 region is between about 1 mm and about 3 mm, and preferably about 2.1 mm.

Through hole 730 may include a first ID region 732 at the upper end of the hole, a second ID region 734 concentrically aligned with and positioned vertically below first ID region 732, and a third ID region 736 concentrically aligned with and positioned vertically below second ID region 734. First ID region 732 may comprise a large ID, second ID region 734 may comprise a small ID, and third ID region 736 may comprise a slightly larger ID than second ID region 734. Third ID region 736 may extend to the lower end of the hole or may be outwardly tapered to an exit ID 737. The taper between the third ID region 736 and the exit ID 737 may taper at an angle $\theta_3$, which may be between about 15° and about 30°, and preferably about 22°. The second ID region 734 may include a chamfered edge that transitions from the first ID region 732 at an angle $\theta_1$, which may be between about 110° and about 140°. Similarly, the second ID region 734 may include a chamfered edge that transitions into the third ID region 736 at an angle $\theta_2$, which may also be between about 110° and about 140°. In one embodiment, the large ID of first region 732 may be between about 2.5 mm and about 7 mm, and preferably about 3.8 mm; the small ID of second ID region 734 may be between about 0.2 mm and about 5 mm, and preferably about 0.4 mm; the slightly larger ID of third ID region 736 may be between about 0.75 mm and about 2 mm, and preferably about 1.1 mm; and the exit ID may be between about 2.5 mm and about 5 mm, and preferably about 3.8 mm.

Figure 7B:
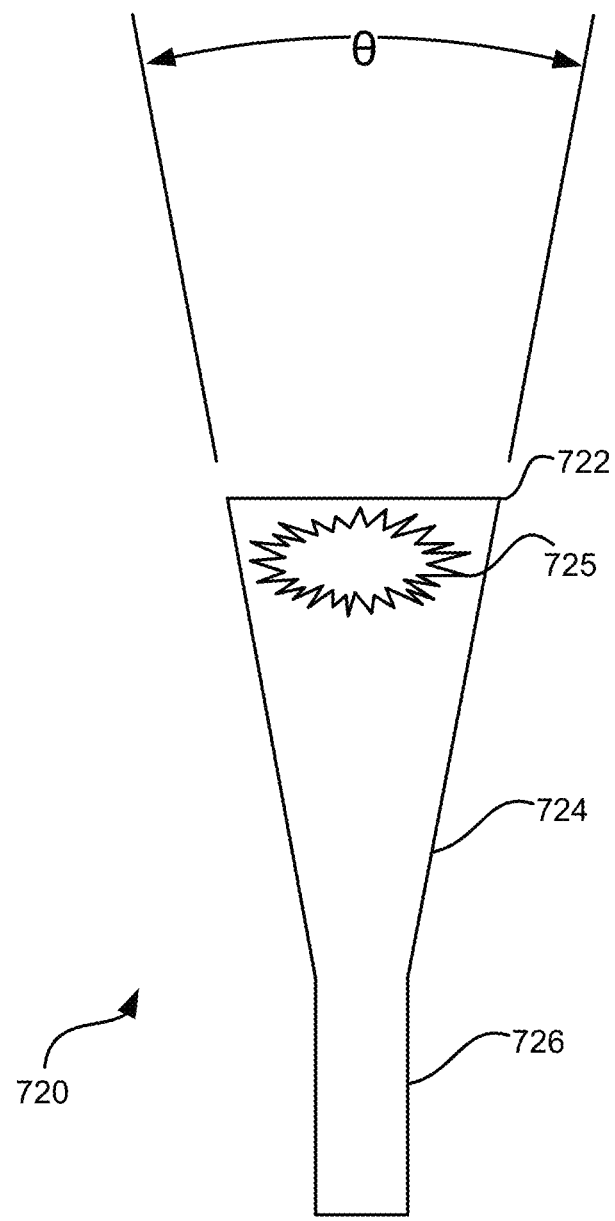
FIG. 7B shows a schematic of a hole geometry for an opening in an ion-suppression element according to an embodiment of the invention.

The transition (blunt, stepped, tapered, etc.) between the large ID regions and small ID regions may substantially block the passage of ion species from passing through the holes while allowing the passage of radical or neutral species. For example, referring now to FIG. 7B, shown is an enlarged illustration of through hole 720 that includes the transition region 724 between the large ID region 722 and the small ID region 726. The tapered region 724 may substantially prevent plasma 725 from penetrating through the through hole 720. For example, as the plasma 725 penetrates into the through hole 720, the ion species may deactivate or ground out by contacting the walls of the tapered region 724, thereby limiting the passage of the plasma through the through hole and containing the plasma within the region above the through hole 720. The radical or neutral species, however, may pass through the through hole 720. Thus, the through hole 720 may filter the plasma 720 to prevent or control the passage of unwanted species. In an exemplary embodiment, the small ID region 726 of the through holes comprises an ID of 1 mm or smaller. To maintain a significant concentration of radical and/or neutral species penetrating through the through holes, the length of the small ID region and/or the taper angle may be controlled.

In addition to preventing the passage of plasma, the through holes described herein may be used to regulate the passage of plasma so that a desired level of plasma is allowed to pass through the through hole. Regulating the flow of plasma through the through holes may include increasing the pressure of the plasma in the gas region above the ion suppressor plate so that a desired fraction of the plasma is able to pass through the ion suppressor without deactivating or grounding out.

Figure 8:
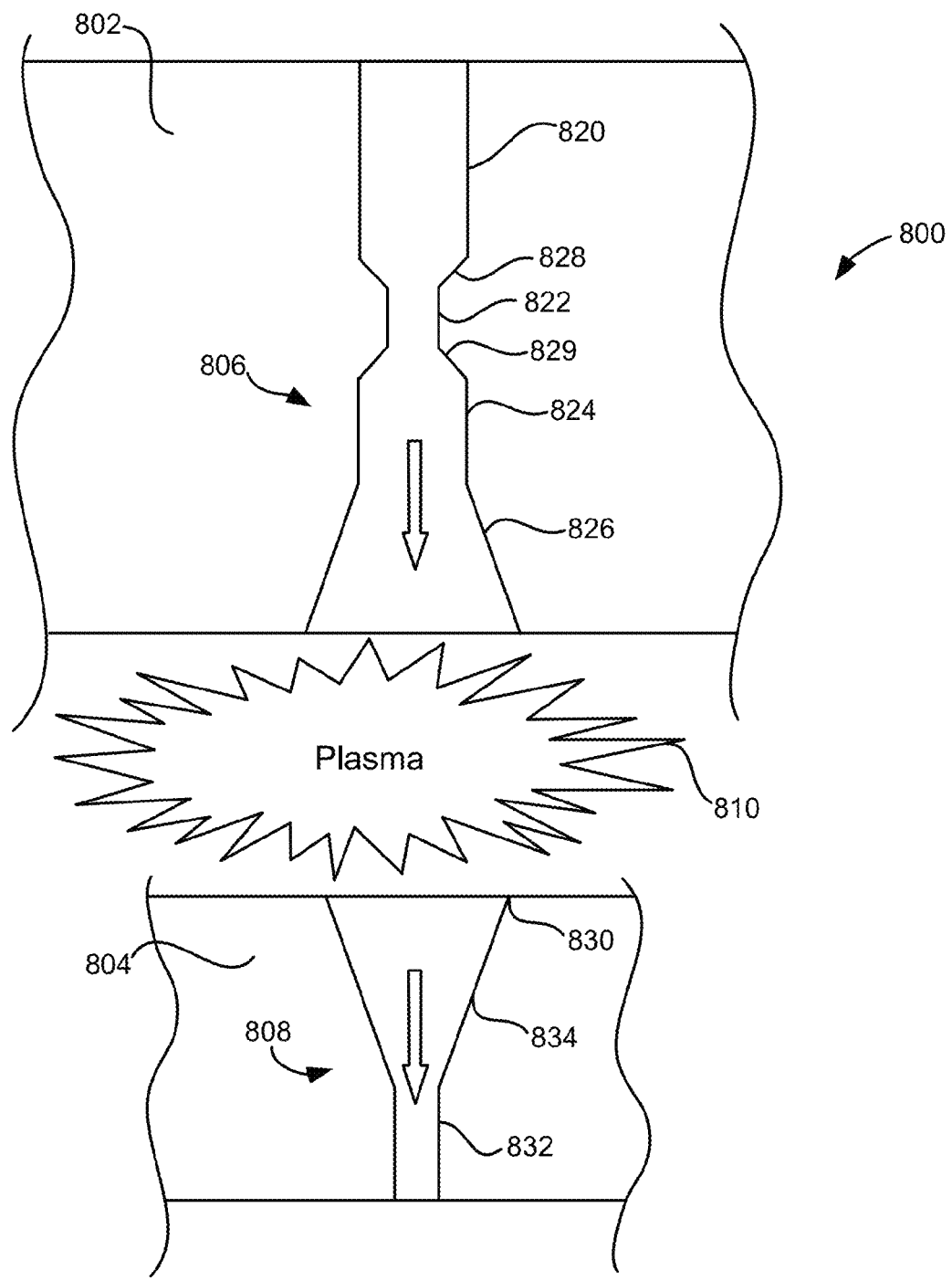
FIG. 8 shows an exemplary configuration of opposing openings in a pair of electrodes that help define a plasma region in a processing chamber according to an embodiment of the invention.

Referring now to FIG. 8, a simplified illustration of a CCP unit 800 is shown. Specifically, the CCP unit 800 shown includes a top plate 802 and a bottom plate 804 that define a plasma generation region 810 in which a plasma is contained. As previously described, the plasma may be generated by an RPS (not shown) and delivered to the plasma generation region 810 via through hole 806. Alternatively or additionally, the plasma may be generated in the CCP unit 800, for example, by utilizing top plate 802 and bottom plate 804 as first and second electrodes coupled to a power generation unit (not shown).

The top plate 802 may include a through hole 806 that allows process gas and/or plasma to be delivered into the plasma generation region 810 while preventing back-streaming of plasma through the top plate 802. The through hole 806 may be configured similar to through hole 730 having first, second, and third ID regions (820, 822, and 824 respectively), with a chamfered edge between adjacent regions (828 and 829) and a tapered region 826 transitioning between third ID region 824 and an exit ID. The tapered region 826 between third ID region 824 and the exit ID and/or the chamfered edge between second and third ID regions (822 and 824 respectively) may prevent back-streaming of plasma by deactivating or grounding ion species as the plasma penetrates into the through hole 806.

Similarly, the bottom plate 804 may include a through hole 808 that allows the radical or neutral species to pass through the through hole while preventing or controlling the passage of ion species. The through hole 808 may be configured similar to through hole 720 having a large ID region 830, a small ID region 832, and a tapered region 834 that transitions between the large ID region 830 and the small ID region 832. The tapered region 834 may prevent the flow of plasma through the through hole 808 by deactivating or grounding ion species as previously explained while allowing radical or neutral species to pass there through.

To further prevent passage of the plasma through the through holes, 806 and/or 808, the top plate 802 and/or bottom plate 804 may receive a charge to electrically bias the plasma and contain the plasma within plasma generation region 810 and/or adjust an ion concentration in the activated gas that passes through the bottom plate. Using top plate 802 and bottom plate 804 in CCP unit 800, the plasma may be substantially generated and/or maintained in the plasma generation region 810, while radical and neutral species are delivered to a gas reaction region to be mixed with one or more precursor gases to etch material from or deposit material on a substrate surface.

Exemplary Processes

In accordance with some embodiments of the invention, an ion suppressor as described above may be used to provide radical and/or neutral species for etch or deposition processes. In one embodiment, for example, an ion suppressor is used to provide fluorine radicals to selectively etch silicon nitride. Using the fluorine radicals, an etch rate selectivity of silicon nitride to silicon oxide of as high as about 80:1 or more can be obtained. One use for such a process is to remove silicon nitride in a replacement gate process. A silicon nitride gate may be selectively removed without removing exposed silicon oxide regions such as gate oxide. The silicon nitride may be replaced with a gate material such as metal.

The ion suppressor may be used to provide a reactive gas having a higher concentration of radicals than ions. Because most of the charged particles of a plasma are filtered or removed by the ion suppressor, the substrate is typically not biased during the etch process. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

Figure 9:
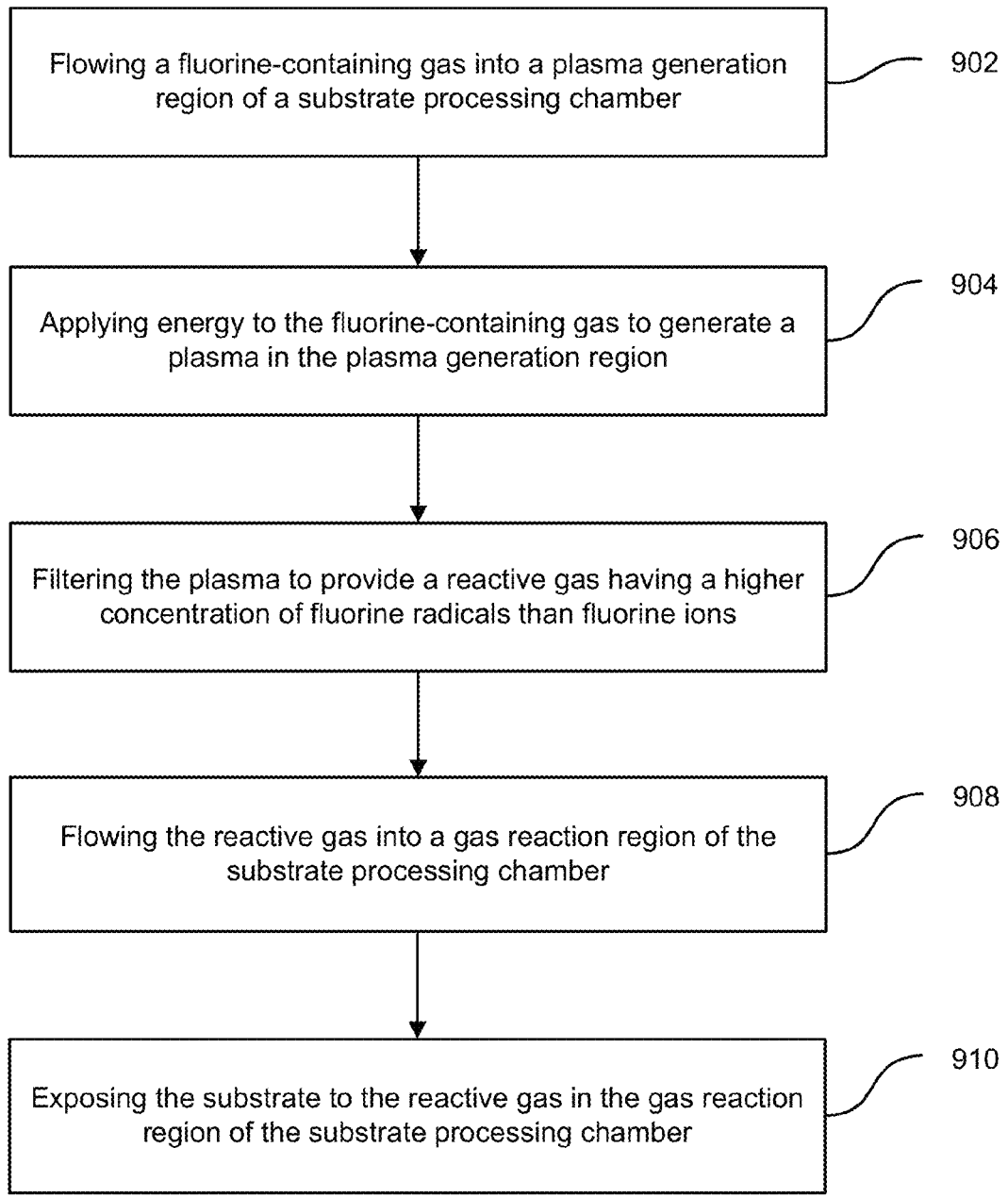
FIG. 9 is a simplified flowchart illustrating an exemplary method of selectively etching silicon nitride from a substrate comprising a silicon nitride layer and a silicon oxide layer according to an embodiment of the invention.

FIG. 9 is a simplified flowchart illustrating an exemplary method of selectively etching silicon nitride from a substrate comprising a silicon nitride layer and a silicon oxide layer according to an embodiment of the invention. The method includes flowing a fluorine-containing gas into a plasma generation region of a substrate processing chamber (902). The fluorine-containing gas may include HF, $F_2$, $NF_3$, $CF_4$, $CHF_3$, $C_2F_6$, $C_3F_6$, $BrF_3$, $ClF_3$, $SF_6$, or the like. Other embodiments may include other halogen-containing gases that do not include fluorine, such as $Cl_2$, HBr, $SiCl_4$, and the like, in place of the fluorine-containing gas. In the exemplary method of FIG. 9, the fluorine-containing gas may also include one or more oxygen sources such as $O_2$, $O_3$, $N_2O$, NO, or the like. Using oxygen can increase an etch rate of the silicon nitride with minimal impact on an etch rate of the silicon oxide. The fluorine-containing gas may also include one or more inert gases such as $H_2$, He, $N_2$, Ar, or the like. The inert gas can be used to improve plasma stability. Flow rates and ratios of the different gases may be used to control etch rates and etch selectivity. In an embodiment, the fluorine-containing gas includes $NF_3$ at a flow rate of between about 5 sccm and 500 sccm, $O_2$ at a flow rate of between about 0 sccm and 5000 sccm, He at a flow rate of between about 0 sccm and 5000 sccm, and Ar at a flow rate of between about 0 sccm and 5000 sccm. One of ordinary skill in the art would recognize that other gases and/or flows may be used depending on a number of factors including processing chamber configuration, substrate size, geometry and layout of features being etched, and the like.

The method also includes applying energy to the fluorine-containing gas to generate a plasma in the plasma generation region (904). As would be appreciated by one of ordinary skill in the art, the plasma may include a number of charged and neutral species including radicals and ions. The plasma may be generated using known techniques (e.g., RF, capacitively coupled, inductively coupled, and the like). In an embodiment, the energy is applied using a CCP unit at a source power of between about 15 W and 5000 W and a pressure of between about 0.2 Torr and 30 Torr. The CCP unit may be disposed remote from a gas reaction region of the processing chamber. For example, the CCP unit and the plasma generation region may be separated from the gas reaction region by an ion suppressor.

The method also includes filtering the plasma to provide a reactive gas having a higher concentration of fluorine radicals than fluorine ions (906). The plasma may be filtered using an ion suppressor disposed between the plasma generation region and the gas reaction region of the substrate processing chamber. The ion suppressor may include a plurality of channels that allow passage of the fluorine radicals and neutral species between the plasma generation region and the gas reaction region. The ion suppressor may be configured to remove some or all of the ions passing from the plasma generation region. In an embodiment, for example, a significant portion of the ions may be removed such that the reactive gas is substantially free from ions.

The method also includes flowing the reactive gas into a gas reaction region of the substrate processing chamber (908). In an embodiment, the ion suppressor may be configured as a showerhead, and the reactive gas exiting the ion suppressor may flow into the gas reaction region proximate to the substrate. Alternatively, the reactive gas exiting the ion suppressor may flow through a showerhead or another gas distributor and into the gas reaction region.

The method also includes exposing the substrate to the reactive gas in the gas reaction region of the substrate processing chamber (910). In an embodiment, the temperature of the substrate may be between about −10° C. and 200° C., and the pressure in the substrate processing chamber may be between about 0.2 Torr and 30 Torr. One of ordinary skill in the art would recognize that other temperatures and/or pressures may be used depending on a number of factors as explained previously. The reactive gas etches the silicon nitride layer at a higher etch rate than the reactive gas etches the silicon oxide layer.

Figure 10:
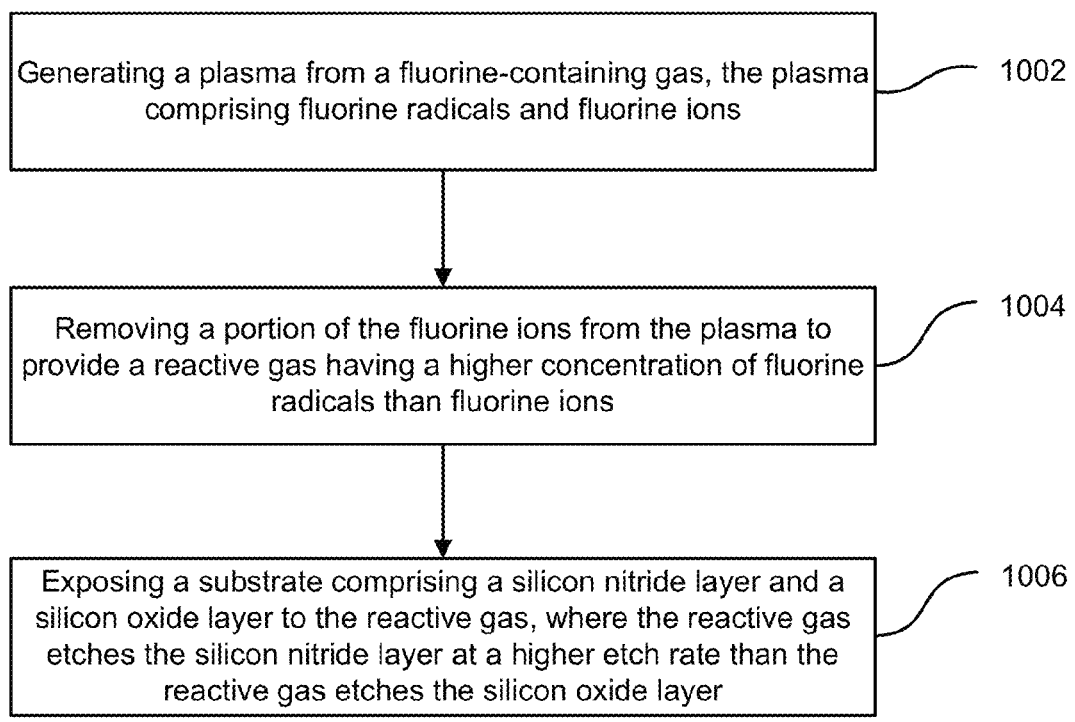
FIG. 10 is a simplified flowchart illustrating an exemplary etch process providing a higher etch rate of silicon nitride than an etch rate of silicon oxide according to an embodiment of the invention.

FIG. 10 is a simplified flowchart illustrating an exemplary etch process providing a higher etch rate of silicon nitride than an etch rate of silicon oxide according to an embodiment of the invention. The process includes generating a plasma from a fluorine-containing gas, the plasma comprising fluorine radicals and fluorine ions (1002). As explained above, the plasma may be formed in a plasma generation region of a substrate processing chamber that is separate from a gas reaction region. The process also includes removing a portion of the fluorine ions from the plasma to provide a reactive gas having a higher concentration of fluorine radicals than fluorine ions (1004). The portion of the fluorine ions may be removed using an ion suppressor. The process also includes exposing a substrate comprising a silicon nitride layer and a silicon oxide layer to the reactive gas, where the reactive gas etches the silicon nitride layer at a higher etch rate than the reactive gas etches the silicon oxide layer (1006).

It should be appreciated that the exemplary processes illustrated in FIGS. 9-10 are not limited to use with the processing chambers illustrated in FIGS. 1-5 or the ion-suppression elements illustrated in FIGS. 6A, 6B, 7A, 7B, and 8-9. Rather, processes in accordance with embodiments of the invention may be performed using other hardware configurations. Further, the specific steps illustrated in FIGS. 9-10 provide particular methods in accordance with embodiments of the present invention. The steps outlined above may be continuously repeated by system software, and other sequences of steps may be performed according to alternative embodiments. For example, the steps outlined above may be performed in a different order. Moreover, the individual steps illustrated in FIGS. 9-10 may include multiple sub-steps that may be performed in various sequences as appropriate to the individual step. Furthermore, additional steps may be added or removed depending on the particular application. One of ordinary skill in the art would recognize many variations, modifications, and alternatives.

It should be noted that the methods and apparatuses discussed throughout the specification are provided merely as examples. Various embodiments may omit, substitute, or add various steps or components as appropriate. For instance, it should be appreciated that features described with respect to certain embodiments may be combined in various other embodiments. Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

What is claimed is:

1. A method of selectively etching silicon nitride from a substrate comprising a silicon nitride layer and a silicon oxide layer, the method comprising:

flowing a fluorine-containing gas into a plasma generation region of a substrate processing chamber separated from a gas reaction region of the substrate processing chamber by a showerhead;

striking a plasma in the plasma generation region, the plasma comprising fluorine radicals and fluorine ions;

filtering the plasma with an ion-suppression element separate from the showerhead to provide a reactive gas having a higher concentration of fluorine radicals than fluorine ions;

flowing the reactive gas into the gas reaction region through the showerhead; and exposing the substrate to the reactive gas in the gas reaction region of the substrate processing chamber, wherein the reactive gas etches the silicon nitride layer at a higher etch rate than the reactive gas etches the silicon oxide layer.

2. The method of claim 1 wherein the fluorine-containing gas comprises $NF_3$.

3. The method of claim 1 wherein the fluorine-containing gas comprises $O_2$.

4. The method of claim 1 wherein the fluorine-containing gas comprises at least one of He or Ar.

5. The method of claim 1 wherein energy is applied to the fluorine-containing gas using a capacitively coupled plasma unit.

6. The method of claim 1 wherein the reactive gas is substantially free from fluorine ions.

7. The method of claim 1 wherein the ion suppression element is disposed between the plasma generation region and the gas reaction region of the substrate processing chamber, the ion suppression element comprising a plurality of channels that allow passage of fluorine radicals between the plasma generation region and the gas reaction region.

8. An etch process providing a higher etch rate of silicon nitride than an etch rate of silicon oxide, the process comprising:

generating a plasma from a fluorine-containing gas, the plasma comprising fluorine radicals and fluorine ions, wherein the plasma is generated remotely from a substrate processing region of a substrate processing chamber;

removing a portion of the fluorine ions from the plasma with an ion-suppression element to provide a reactive gas having a higher concentration of fluorine radicals than fluorine ions;

flowing the reactive gas through a showerhead into the substrate processing region, wherein the showerhead is a separate element from the ion-suppression element; and exposing a substrate comprising a silicon nitride layer and a silicon oxide layer to the reactive gas, wherein the reactive gas etches the silicon nitride layer at a higher etch rate than the reactive gas etches the silicon oxide layer.

9. The process of claim 8 wherein the fluorine-containing gas comprises $NF_3$.

10. The process of claim 8 wherein the fluorine-containing gas comprises $O_2$.

11. The process of claim 8 wherein the fluorine-containing gas comprises at least one of He or Ar.

12. The process of claim 8 the plasma is generated using a capacitively coupled plasma unit.

13. The process of claim 8 the reactive gas is substantially free from fluorine ions.

14. The process of claim 8 wherein the ion suppression element comprises a plurality of channels that allow passage of fluorine radicals and suppression of fluorine ions.

15. The process of claim 8 wherein the substrate is unbiased during etch of the silicon nitride layer.

16. A method of selectively etching a semiconductor substrate in a semiconductor processing chamber, the method comprising: flowing a fluorine-containing precursor into a first region of the semiconductor processing chamber, the first region of the semiconductor processing chamber being separated from a second region of the semiconductor processing chamber by a showerhead; striking a plasma in the first region to produce plasma species comprising fluorine radicals and fluorine ions; filtering the plasma species with an ion-suppression device to provide a reactive gas having a higher concentration of fluorine radicals than fluorine ions, wherein the ion-suppression device is a device separate from the showerhead; flowing the reactive gas into the second region through the showerhead; and exposing the semiconductor substrate positioned in the second region to the reactive gas to etch at least a portion of the semiconductor substrate, wherein the semiconductor substrate comprises an exposed region of silicon nitride and an exposed region of silicon oxide, and wherein the silicon nitride etches at a higher rate than the silicon oxide.

\* \* \* \* \*